(12) United States Patent
Huang et al.

(10) Patent No.: US 10,050,044 B2
(45) Date of Patent: Aug. 14, 2018

(54) STATIC RANDOM-ACCESS MEMORY DEVICE

(71) Applicant: UNITED MICROELECTRONICS CORP., Hsin-Chu (TW)

(72) Inventors: Li-Ping Huang, Miaoli County (TW); Chun-Hsien Huang, Tainan (TW); Yu-Tse Kuo, Tainan (TW); Ching-Cheng Lung, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/422,471

(22) Filed: Feb. 2, 2017

(65) Prior Publication Data
US 2018/0182766 A1 Jun. 28, 2018

(30) Foreign Application Priority Data

Dec. 28, 2016 (TW) .............................. 105143532 A

(51) Int. Cl.
| | | |
|---|---|---|
| *H01L 27/11* | (2006.01) | |
| *H01L 27/092* | (2006.01) | |
| *G11C 11/412* | (2006.01) | |
| *G11C 7/14* | (2006.01) | |
| *G11C 11/419* | (2006.01) | |
| *H01L 27/02* | (2006.01) | |
| *G11C 7/22* | (2006.01) | |
| *H01L 27/105* | (2006.01) | |
| *G11C 7/02* | (2006.01) | |

(52) U.S. Cl.
CPC .......... *H01L 27/1104* (2013.01); *G11C 7/02* (2013.01); *G11C 7/14* (2013.01); *G11C 7/22* (2013.01); *G11C 11/412* (2013.01); *G11C 11/419* (2013.01); *H01L 27/02* (2013.01); *H01L 27/092* (2013.01); *H01L 27/105* (2013.01); *H01L 27/1116* (2013.01)

(58) Field of Classification Search
CPC .. H01L 27/1104; H01L 27/1116; H01L 27/02; H01L 27/092; H01L 27/105; G11C 11/412; G11C 11/419; G11C 7/02; G11C 7/14; G11C 7/22
USPC ......... 257/368, 369, 401, E27.098, E27.099, 257/E27.06, E27.081, E21.409, E21.661; 438/294; 365/104, 154, 189.07, 189.09, 365/189.14, 210.1, 230.01, 230.03
See application file for complete search history.

(56) References Cited

U.S. PATENT DOCUMENTS

| | | | |
|---|---|---|---|
| 6,717,842 B2 | 4/2004 | Watanabe | |
| 7,376,032 B2* | 5/2008 | Nguyen | .................... G11C 7/12 365/189.09 |
| 2009/0134467 A1* | 5/2009 | Ishida | ................ H01L 21/26506 257/368 |
| 2012/0319212 A1* | 12/2012 | Liaw | .................... H01L 27/0207 257/401 |

(Continued)

*Primary Examiner* — Dao H Nguyen
(74) *Attorney, Agent, or Firm* — Winston Hsu

(57) ABSTRACT

The present invention proposes a static random-access memory device (SRAM). The static random-access memory device is composed of two P-channel gates of loading transistor, two N-channel gates of driving transistor and two N-channel gates of accessing transistor in a memory cell. A dummy gate is disposed adjacent to the N-channel gate of accessing transistor with a bit line node disposed therebetween, wherein the dummy gate is electrically connected to a ground voltage through a metal layer.

14 Claims, 5 Drawing Sheets

(56) References Cited

U.S. PATENT DOCUMENTS

2015/0170713 A1* 6/2015 Ukai .................. G11C 5/025
365/189.011
2015/0255462 A1* 9/2015 Liaw .................. G11C 11/412
257/369

* cited by examiner

STATIC RANDOM-ACCESS MEMORY DEVICE

BACKGROUND OF THE INVENTION

1. Field of the Invention

The application relates to the general field of Integrated Circuit (IC) devices, and more particularly to SRAM (Static Random-Access Memory) cells comprising FinFETs (Fin Field-Effect Transistors).

2. Description of the Prior Art

Over the past 40 years, one has seen a dramatic increase in functionality and performance of Integrated Circuits (ICs). In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed. There are two main classes of components in Complementary Metal Oxide Semiconductor (CMOS) ICs, namely transistors and wires. With "scaling", transistor performance and density typically improve and this has contributed to the previously-mentioned increases in IC performance and functionality. However, wires (interconnects) that connect together transistors degrade in performance with "scaling". The situation today is that wires dominate performance, functionality and power consumption of ICs.

Logic circuits and embedded static random-access memory (SRAM) cells are frequently integrated into semiconductor devices for increased functional density. Such applications range from industrial and scientific subsystems, automotive electronics, cell phones, digital cameras, microprocessors, and so on. SRAM cells have the advantageous feature of holding data without a need for refreshing. SRAM cells may include different numbers of transistors, and are often referred to by the number of transistors, for example, six-transistor (6T) SRAM, eight-transistor (8T) SRAM, and the like. The transistors typically form a data latch for storing a bit. Additional transistors may be added to control access to the transistors. SRAM cells are typically arranged as an array having rows and columns. Each row of the SRAM cells is connected to a word line, which determines whether the current SRAM cell is selected or not. Each column of the SRAM cells is connected to a bit line (or a pair of complementary bit lines), which is used for writing a bit into, or reading a bit from, the SRAM cell.

To meet the demand for higher SRAM density, simply scaling down the semiconductor feature size is no longer enough. For example, the traditional SRAM cell structure with planar transistors has experienced degraded device performance and higher leakage when manufactured with smaller semiconductor geometries. One of the techniques for meeting such a challenge is to use three-dimensional transistors having a fin or multi-fin structure (e.g., FinFETs). For example, FinFETs can be implemented for controlling short channel effect for metal-oxide-semiconductor field-effect transistors (MOSFETs). To achieve optimal short channel control and area reduction, the fin structures are desired to be as thin as possible. One of the techniques for manufacturing very thin fin structures is spacer lithography. For example, spacers are formed on sidewalls of mandrel patterns. After the mandrel patterns are removed, the spacers become an etch mask for etching a silicon substrate in forming the fin structures. The dimensions of the mandrel patterns and spacers control the width and pitch of the fin structures. A tight control of critical dimension (CD) uniformity of the mandrel patterns and spacers is a design challenge for embedded FinFET SRAM.

Recent advances in FinFET transistor technology have made advanced SRAM cells using FinFET transistors possible. However, the smaller feature size in advance semiconductor technology may still lead to leakage issue in the device. For example, a bit cell in SRAM is likely to suffer serious sub-threshold leakage issue when there are adjacent dummy cell or word lines in floating state. The current may leak from the bit cell to the dummy cell because the adjacent dummy word line is not completely turned off. As the demand for even smaller electronic devices has grown recently, there has grown a need for reducing leakage current of semiconductor devices.

SUMMARY OF THE INVENTION

One objective of the present invention is to provide a static random-access memory (SRAM) device with better leakage proof when there are dummy patterns for mitigating the loading effect, while the pattern uniformity may be further improved by adding corresponding dummy patterns without affecting the original layout design and process flow.

To achieve the aforesaid objective, a SRAM device is provided in one embodiment of the present invention, which includes a substrate; a memory cell on the substrate, wherein the memory cell includes two P-channel gates of loading transistor, two N-channel gates of driving transistor and two N-channel gates of accessing transistor; at least one dummy gate adjacent to the N-channel gate of accessing transistor on the substrate, wherein the dummy gate and the N-channel gate of accessing transistor adjacent to the dummy gate span over an active region; a bit line node between the dummy gate and the N-channel gate of accessing transistor adjacent to the dummy gate, wherein the bit line node electrically connects to the active region; and a metal layer electrically connecting to the dummy gate, wherein the dummy gate is electrically connected to a ground voltage through the metal layer.

To achieve the aforesaid objective, alternatively, a SRAM device is provided in another embodiment of the present invention, which includes a substrate; a memory cell on the substrate, wherein the memory cell comprises two P-channel gates of loading transistor, two N-channel gates of driving transistor and two N-channel gate of accessing transistor; at least one dummy gate adjacent to the N-channel gate of accessing transistor on the substrate, wherein the dummy gate and the N-channel gate of accessing transistor adjacent to the dummy gate span over an active region; a bit line node between the dummy gate and the N-channel gate of accessing transistor adjacent to the dummy gate, where the bit line electrically connects to said active region; a pick-up well region adjacent to the dummy gate on the substrate; and a pick-up power line electrically connecting to the pick-up well region, wherein the pick-up power line extends over and electrically connects to the dummy gate, wherein the dummy gate is electrically connected to a ground voltage through the pick-up power line.

The SRAM device of the present invention is provided with a dummy gate completely turned off through the metal line connected to a ground voltage. The bit line adjacent to the dummy gate is, therefore, not subject to the sub-threshold leakage and be pulled down by the dummy gate, which prevent the SRAM bit line fail issue.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

For a more complete understanding of the embodiments, and the advantages thereof, reference is now made to the following descriptions taken in conjunction with the accompanying drawings, in which.

Figure 1:
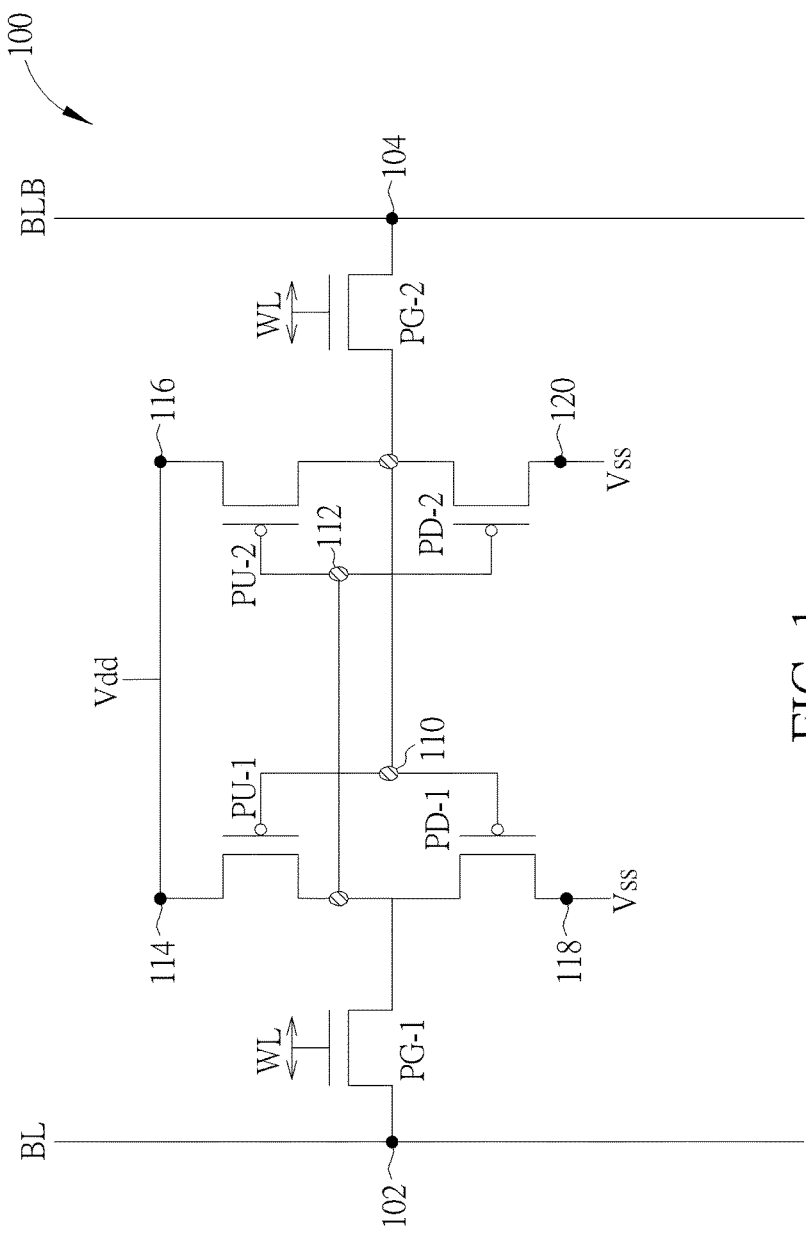
FIG. 1 is a circuit diagram of a static random access memory (SRAM) cell.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A Static Random Access Memory (SRAM) cell is provided in accordance with various exemplary embodiments. The variations of the embodiments are discussed. Throughout the various views and illustrative embodiments, like reference numbers are used to designate like elements.

FIG. 1 illustrates a circuit diagram of SRAM cell 100 in accordance with one embodiment of the present invention. SRAM cell 100 includes pull-up transistors PU-1 and PU-2, which are P-channel Metal-Oxide-Semiconductor (PMOS) transistors, and pass-gate transistors PG-1 and PG-2 and pull-down transistors PD-1 and PD-2, which are N-type Metal-Oxide-Semiconductor (NMOS) transistors. The gates of pass-gate transistors PG-1 and PG-2 are controlled by word-line WL (not shown) that determines whether SRAM cell 100 is selected or not. A latch formed of pull-up transistors PU-1 and PU-2 and pull-down transistors PD-1 and PD-2 stores a bit, wherein the complementary values of the bit are stored in data node 110 and data node 112. The stored bit can be written into, or read from, SRAM cell 100 through bit lines BL 102 and BLB 104. SRAM cell 100 is powered through a positive power supply node Vdd that has a positive power supply voltage (also denoted as Vdd). SRAM cell 100 is also connected to power supply voltage Vss, which may be an electrical ground. Transistors PU-1 and PD-1 form a first inverter. Transistors PU-2 and PD-2 form a second inverter. The input of the first inverter is connected to transistor PG-1 and the output of the second inverter, and the output of the first inverter is connected to transistor PG-2 and the input of the second inverter to form corporately as a double latch structure.

Refer again to FIG. 1. The sources of pull-up transistors PU-1 and PU-2 are connected to Vdd node 114 and Vdd node 116, respectively, which are further connected to power supply voltage (and line) Vdd. The sources of pull-down transistors PD-1 and PD-2 are connected to Vss node 118 and Vss node 120, respectively, which are further connected to power supply voltage/line Vss. The gates of transistors PU-1 and PD-1 are connected to the drains of transistors PU-2 and PD-2, which connection node is referred to as data node 110. The gates of transistors PU-2 and PD-2 are connected to the drains of transistors PU-1 and PD-1, which connection node is referred to as data node 112. A source/drain region of pass-gate transistor PG-1 is connected to bit line BL at a BL node. A source/drain region of pass-gate transistor PG-2 is connected to bit line BLB 308 at a BLB node.

Figure 2:
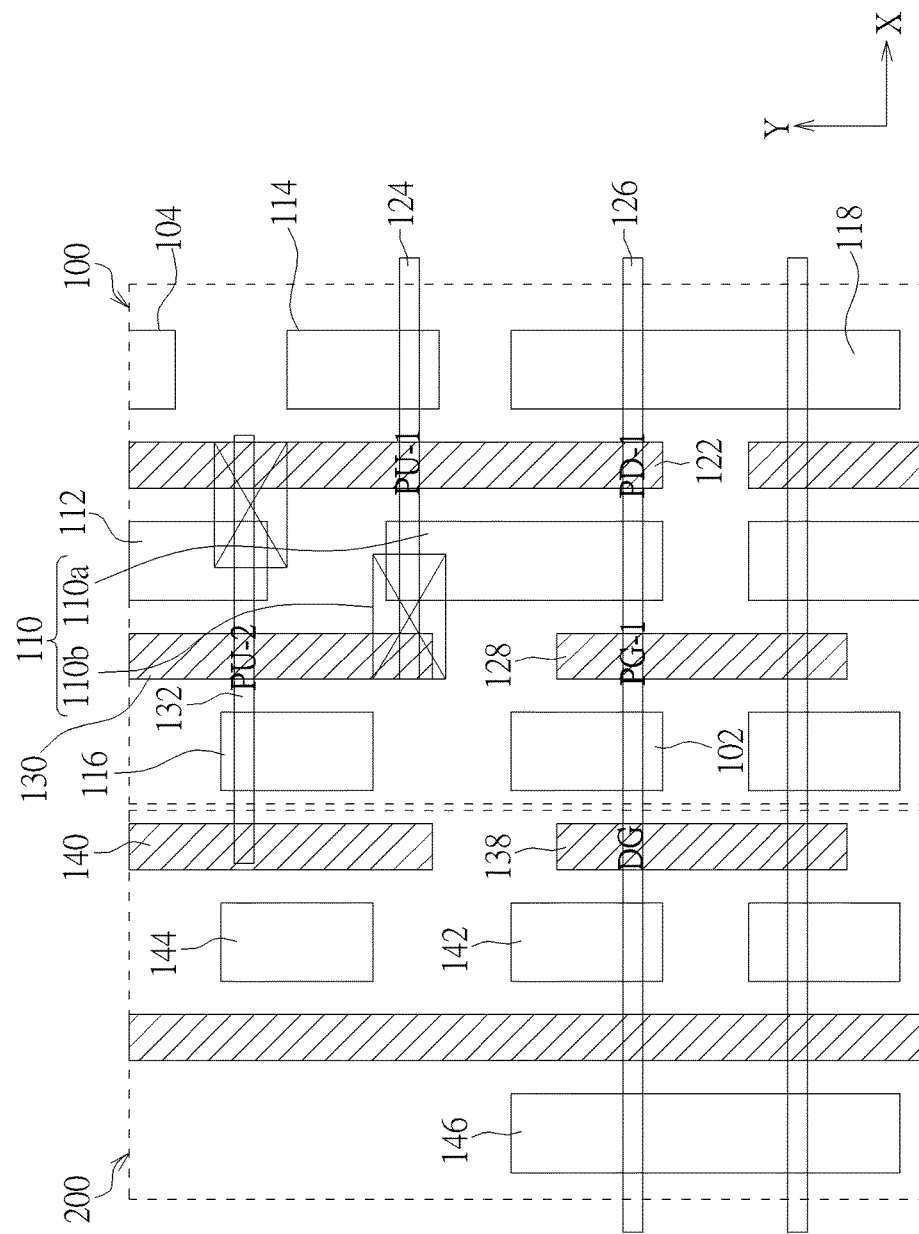
FIG. 2 is a layout of the SRAM cell in accordance with one embodiment.

FIG. 2 illustrates a layout of SRAM cell 100 in accordance with exemplary embodiments. In some embodiments, the layout has a Graphic Database System (GDS) format, and may be embodied on a tangible non-transitory storage medium such as a hard disk. The layout may be accessed and processed by a computer. Furthermore, the layouts as illustrated throughout the description may be formed on lithography masks that have transparent and opaque patterns, in which lithography masks are used to expose photo resists, so that features as illustrated throughout the description are formed to have the illustrated patterns (shapes). Accordingly, each of the layouts in the present disclosure may also represent a plurality of lithography masks incorporating the patterns shown in the respective layout.

In this embodiment, the layout of SRAM cell 100 is not completely shown in FIG. 2 for the simplicity of the disclosure. Only half components of SRAM cell 100, i.e. an inverter consisted of a pass-gate transistors PG-1, a pull-down transistors PD-1 and a pull-up transistors PU-1, are shown in the figure. These portions would be sufficient for those of skill in the art to understand and implement the embodiment of the present invention. In addition, an edge cell 200, or what will be referred hereinafter as a dummy cell, is provided adjacent to SRAM cell 100. The dummy cell 200 in semiconductor field is usually disposed between SRAM array and the peripheral region to serve as a dummy region to tackle with the micro loading effect. The outer boundaries of SRAM cell 100 and the dummy cell 200 in FIG. 2 are illustrated using dashed lines, which forms a rectangle.

Please refer to FIG. 2. Some components such as Vdd node 114, Vdd node 116, Vss node 118, the BL node, and the BLB node are also shown in the figure. A gate electrode 122 forms pull-up transistor PU-1 with the underlying active region (an n-well region) 124, which may be fin-based. Gate electrode 122 further forms pull-down transistor PD-1 with the underlying active region (a p-well region) 126, which may be fin-based. Gate electrode 128 forms pass-gate transistor PG-1 with the underlying active region 126. Gate electrode 130 forms pull-up transistor PU-2 with an underlying active region (an n-well region) 132. Transistors PG-1, PU-1, PU-2 and PD-1 may be Fin Field-Effect Transistors (FinFETs) in accordance with the embodiments of the present invention.

As shown in FIG. 2, a data node 110 includes an OD level contact plug 110a and a gate contact plug 110b respectively.

OD level contact plug 110a has a longitudinal direction in the Y direction, which is parallel to the extending directions of gate electrodes 122, 128 and 130. Two ends of the OD level contact plug 110a are formed respectively over and electrically interconnects active regions (drain regions) 124 and 126. Gate contact plug 110b comprises a portion over and is electrically connected to gate electrode 130. In the embodiments, gate contact plug 110b has a longitudinal direction in the X direction.

Furthermore, gate contact plug 110b overlaps one end of the OD level contact plug 110a. Accordingly, when the layout in FIG. 2 is implemented on a physical semiconductor chip with SRAM cell, gate contact plug 110b is merged with the OD level contact plug 110a to form a data node 110. The gate contact plug 110b and the OD level contact plug 110a, when implemented on the semiconductor chip, may be formed using a same metal-filling process, and form an integrated and continuous data node 110. The other data node 112 of the SRAM cell 100 with the same configuration as the data node 110 is shown in upper portion of FIG. 2. Relevant redundant description will be herein omitted for the simplicity of the disclosure.

Please refer again to FIG. 2. In the case that the SRAM cell 100 is disposed at outermost region of the memory array, the layout patterns such as gate electrodes 128 and 130 or BL Node and Vdd Node near the cell edge would suffer micro loading effect. Abnormal patterns resulted from the micro loading effect would severely impact the electrical performance of the memory device. In order to solve this problem, a dummy cell is usually disposed between the outermost SRAM cell 100 and the peripheral region (not shown) to provide dummy patterns for compensating the micro loading effect.

In the embodiment, as it is shown in FIG. 2, there are several dummy patterns configured to compensate the micro loading effect. A dummy gate electrode 138 and a dummy gate electrode 140 are disposed at the edge of the dummy cell 200 adjacent to the SRAM cell 100. Dummy gate electrode 138 and gate electrodes 128 are configured symmetric with respect to the BL Node, and dummy gate electrode 140 and gate electrode 130 are configured symmetric with respect to Vdd Node 116. Dummy BL Node 142 and BL Node are configured symmetric with respect to dummy gate electrodes 138, and dummy Vdd Node 144 and Vdd Node 116 are configured symmetric with respect to dummy gate electrode 140. It is noted that the dummy gate electrode 138 spans over the active region 126 like the gate electrode 128 to form a dummy gate transistor DG. In addition, in one embodiment of the present invention, the dummy cell 200 may also provide an area as a pick-up region. A pick-up contact plug 146 may be disposed adjacent to the dummy BL Node 142 to provide the power connection between the underlying pick-up well region (P-well) and a ground voltage or common voltage Vss through the pick-up power line. Alternatively, in other embodiment of the present invention, the dummy cell 200 may be disposed within the memory array rather than at the edge area between the memory array and the peripheral region. For example, the dummy cell may serves as a gap cell between two groups of memory cells for providing pick-up power line or compensating dummy patterns.

Figure 3:
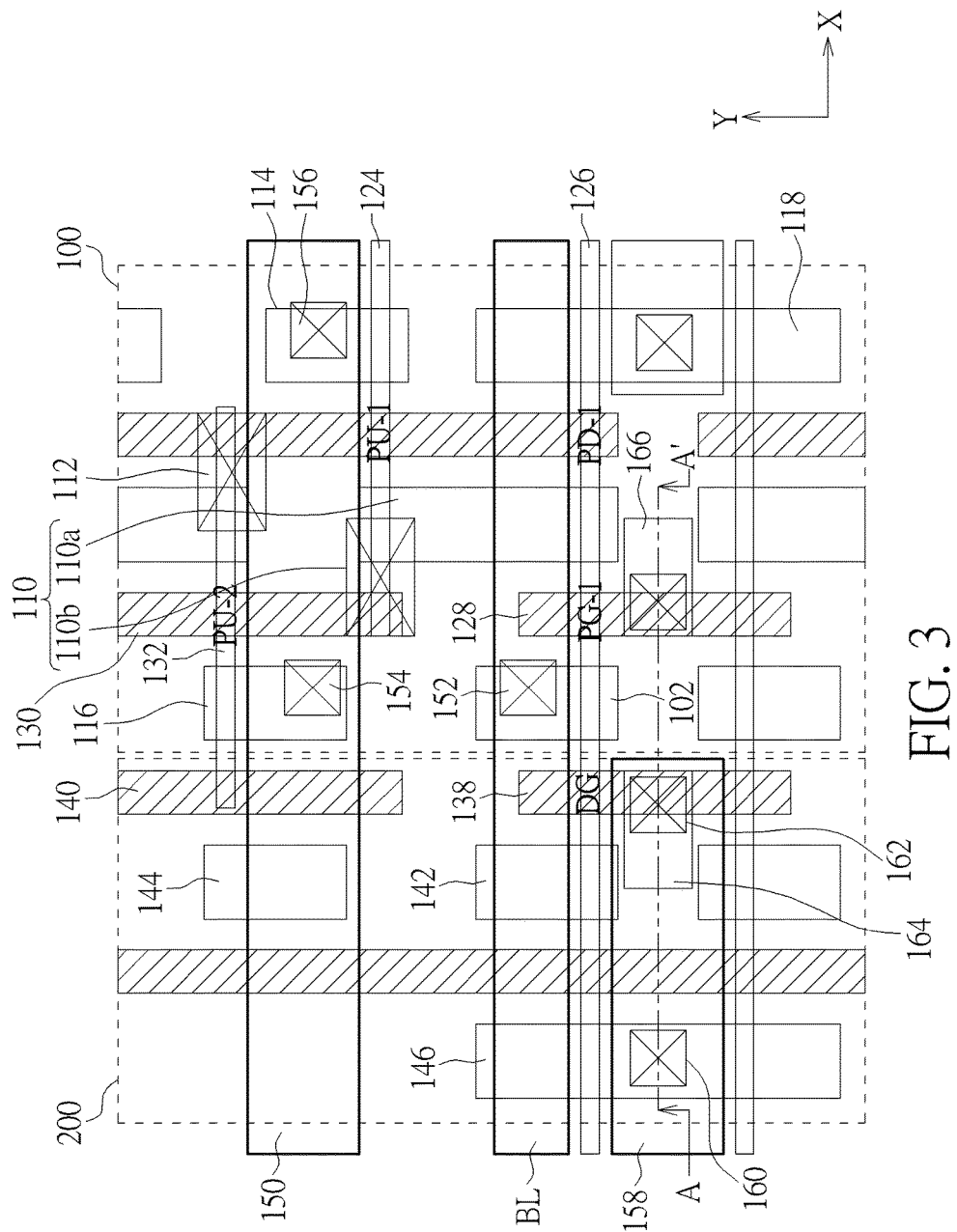
FIG. 3 is a layout of the SRAM cell including the patterns in interlayer dielectric (ILD) level and the patterns of first metal layer (M1) in accordance with one embodiment.

FIG. 3 illustrates a layout of the SRAM cell including the patterns in interlayer dielectric (ILD) level and the patterns of first metal layer (M1) in accordance with one embodiment. Bit line 148 and Vdd line 150 are formed in M1 level and pass through the SRAM cell 100 and the dummy cell 200. BL line 148 and Vdd line 150 are parallel to active regions 124 and 126 in the X direction. In an exemplary connection scheme, BL line 148 is connected to underlying via 152, which is further connected to underlying BL node. Vdd line 150 is connected to underlying vias 154 and 156, which is further connected to underlying Vdd Node 114 and Vdd Node 116 respectively provide the power supply voltage Vdd. Vdd Node 114 would further carry the power supply voltage Vdd to the active region 124, data node 110 and the active region 126 between the pass-gate PG-1 and pull-down gate PD-1. The identical operation of Vdd Node 116 and data node 112 of the other inverter in SRAM will be herein omitted for the simplicity of the disclosure.

In conventional connection scheme, dummy gate DG adjacent to the pass-gate transistors PG-1 is always turned off in a floating state without connecting to any voltage or power lines. However, a leakage path may be easily induced from the BL node to the adjacent dummy BL node 142 through the dummy gate DG due to the dummy gate in floating state not being completely turned off. In this case, the BL node would be pulled low by the dummy gate DG, thereby causing a SRAM bit line fail issue.

In order to solve this leakage issue, please refer to FIG. 3, the present invention provides an extended pick-up power line 158 formed in M1 level passing through the pick-up region to the dummy gate electrode 138. The pick-up power line 158 is parallel to active regions 124 and 126 in the X direction like BL 148 and the Vdd line 150. In an exemplary connection scheme, the pick-up power line 158 is connected to underlying vias 160 and 162, which are further connected to the underlying pick-up contact plug 146 and dummy gate electrode 138 respectively in OD level. Since the pick-up contact plug 146 is electrically connected to a ground voltage or a common voltage Vss through power connections in other metal levels, the dummy gate electrode 138 connected to the pick-up contact plug 146 would also be electrically connected to the ground voltage or the common voltage Vss. Therefore, the dummy gate DG is ground and completely turned off. No more leakage will occur from BL node to dummy BL node 142, thereby solving the SRAM bit line fail issue. Alternatively, in other embodiment, the dummy gate DG may be also connected to ground by other metal lines rather than the pick-up power line 158. The dummy gate DG is not limited to be connected to the ground or common voltage only through the pick-up power line 158.

Figure 4:
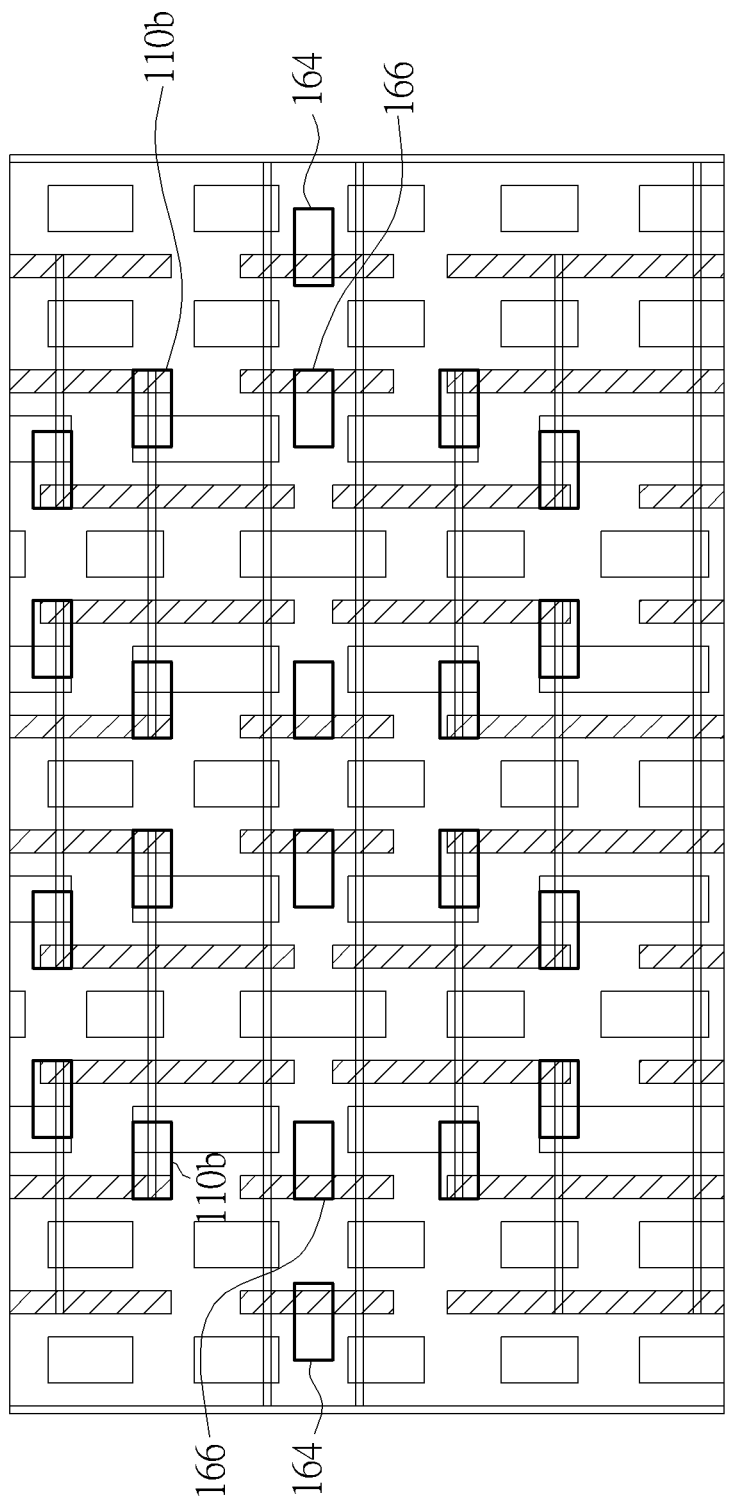
FIG. 4 is a cross-sectional view taken along line A-A' in FIG. 3.

In addition, in the embodiment, an additional first conductive pattern 164 may be further provided on the dummy gate electrode 138 in OD level, wherein the first conductive pattern 164 is symmetric to a regular second conductive pattern 166 on the gate electrode 128 with respect to BL node. As it is shown in FIG. 4, which illustrates an overview layout of the SRAM cell with the distribution of poly patterns in OD level, the patterns of M0 level in the embodiment may include the gate contact plug 110b of the data node 110, the first conductive pattern 164 on the dummy electrode and the second conductive pattern 166 on the gate electrode, wherein the first conductive pattern 164 and the second conductive pattern 166 also serve as gate contacts like gate contact plug 110b to connect with vias in Via_0 level above. In the embodiment, the additional first conductive pattern 164 on the dummy gate electrode not only serve as contact plug to connect with via, but may also help to compensate and regulate the patterns in M0 level and achieve better pattern uniformity for the layout of M0 level.

Figure 5:
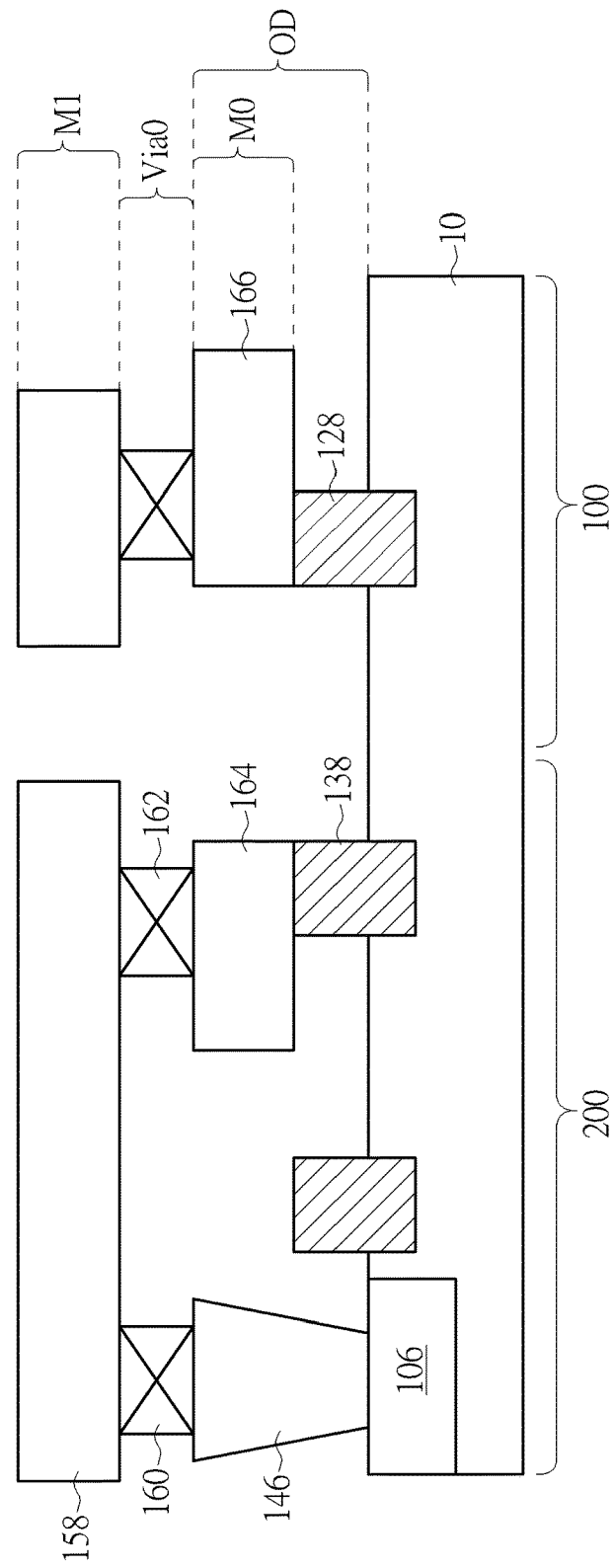
FIG. 5 is an overview layout of the SRAM cell illustrating the distribution of poly patterns in OD level.

FIG. 5 illustrates a schematic cross-sectional view taken along the line A-A' in FIG. 3, which layers are formed on a semiconductor substrate or wafer 10. It is noted that FIG. 5 is schematically illustrated to show various levels of interconnect structure and transistors, and may not reflect the actual cross-sectional view of SRAM cell 100 and dummy cell 200. The interconnect structure includes an OD (wherein the term "OD" represents "active region") level, via levels Via_0 and metal layers M1, wherein the M0 level is included in OD level. Each of the levels includes one or more dielectric layers and the conductive features formed therein. The conductive features that are at the same level may have top surfaces substantially level with each other, bottom surfaces substantially level with each other, and may be formed simultaneously. The OD level connects gate electrodes of transistors (such as the illustrated exemplary transistors DG, PG-1, PD-1 and PU-1) to an overlying level such as the Via_0 level. The OD level also connects source and drain regions of transistors, pickup regions of well regions, and the like to an overlying level such as the Via_0 level.

As it is clearly shown in FIG. 5, pick-up contact plug 146 is electrically connected to the pick-up well region 06 on the substrate 10, and is further connected to the overlaying pick-up power line 158 through vias 160. The pick-up power line 158 would be connected to a ground voltage or a common voltage Vss through other metal layers, thereby achieving its pick-up function. The pick-up power line 158 may further extend onto the dummy gate electrode 138 and be electrically connected to first conductive pattern 164 through via 162, thereby providing ground voltage or common voltage Vss to dummy gate transistor DG. Accordingly, the dummy gate DG would be grounded and shut completely. No more current may flow into the dummy bit line node through the active region from bit line node.

In the embodiment, word lines and Vss line (not shown) carrying power supply voltage Vss may be disposed in M2 level and be parallel to the Y direction perpendicular to the BL 148 and the Vdd line 150. In an exemplary connection scheme, the word line is connected to the underlying pass-gate transistors PG-1 and PG-2 in OD level through vias. Vss line is connected to underlying Vss node in OD level, which is further connected to a portion of active region 126, and a portion of active regions may act as a source of pull-down transistor PD-1 in FIG. 2. Since the layout and the connection of word line and Vss line in the present invention is a conventional feature in the semiconductor field, relevant configuration and drawing will be herein omitted for the simplicity of the specification and preventing from obscuring the objective of the present invention.

According to the disclosure above, the present invention proposes a static random-access memory (SRAM) device with better leakage proof when there are adjacent dummy patterns for mitigating the loading effect, while the pattern uniformity may be further improved by adding corresponding dummy patterns and M0 contact patterns without affecting the original layout design and process flow.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A static random-access memory device, comprising:
   a substrate;
   a memory cell on said substrate, wherein said memory cell comprises two P-channel gates of loading transistor, two N-channel gates of driving transistor and two N-channel gates of accessing transistor;
   at least one dummy gate adjacent to said N-channel gate of accessing transistor on said substrate, wherein said dummy gate and said N-channel gate of accessing transistor adjacent to said dummy gate span over a same active region;
   a metal layer electrically connecting to said dummy gate, wherein said dummy gate is electrically connected to a ground voltage through said metal layer.

2. The static random-access memory device of claim 1, further comprising a bit line node between said dummy gate and said N-channel gate of accessing transistor adjacent to said dummy gate, wherein said bit line node electrically connects to said active region.

3. The static random-access memory device of claim 2, further comprising a first conductive pattern and a second conductive pattern respectively on said dummy gate and said N-channel gate of accessing transistor adjacent to said dummy gate, wherein said first conductive pattern and said second conductive pattern are symmetric with respect to said bit line node.

4. The static random-access memory device of claim 3, further comprising a via electrically connecting said first conductive pattern and said metal layer.

5. The static random-access memory device of claim 2, wherein the pattern of said dummy gate and the pattern of said N-channel gate of accessing transistor adjacent to said dummy gate are symmetric with respect to said bit line node.

6. The static random-access memory device of claim 2, further comprising a dummy bit line node symmetric to said bit line node with respect to said dummy gate, wherein said dummy bit line node electrically connects to said active region.

7. The static random-access memory device of claim 6, wherein said dummy gate and said dummy bit line node are located in a dummy cell adjacent to said memory cell.

8. The static random-access memory device of claim 1, wherein said N-channel gate of accessing transistor electrically connects to a word line.

9. The static random-access memory device of claim 1, wherein said P-channel gates of loading transistor is a pull-up gate, said N-channel gates of driving transistor is a pull-down gate, and said N-channel gates of accessing transistor is a pass gate.

10. A static random-access memory device, comprising:
    a substrate;
    a memory cell on said substrate, wherein said memory cell comprises two P-channel gates of loading transistor, two N-channel gates of driving transistor and two N-channel gate of accessing transistor;
    at least one dummy gate adjacent to said N-channel gate of accessing transistor on said substrate, wherein said dummy gate and said N-channel gate of accessing transistor adjacent to said dummy gate span over a same active region;
    a pick-up well region adjacent to said dummy gate on said substrate; and
    a pick-up power line electrically connecting to said pick-up well region, wherein said pick-up power line extends over and electrically connects to said dummy gate, wherein said dummy gate is electrically connected to a ground voltage through said pick-up power line.

11. The static random-access memory device of claim 10, further comprising a bit line node between said dummy gate and said N-channel gate of accessing transistor adjacent to said dummy gate, wherein said bit line node electrically connects to said active region.

12. The static random-access memory device of claim 11, further comprising a first conductive pattern and a second conductive pattern respectively on said dummy gate and said N-channel gate of accessing transistor adjacent to said dummy gate, wherein said first conductive pattern and said second conductive pattern are symmetric with respect to said bit line node.

13. The static random-access memory device of claim 12, further comprising a via electrically connecting said first conductive pattern and said pick-up power line.

14. The static random-access memory device of claim 10, wherein said pick-up well region is a p-well region.

* * * * *